(12) United States Patent
Kim

(10) Patent No.: US 7,615,493 B2
(45) Date of Patent: Nov. 10, 2009

(54) METHOD FOR FORMING ALIGNMENT MARK

(75) Inventor: Seok Kyun Kim, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 552 days.

(21) Appl. No.: 11/481,597

(22) Filed: Jul. 5, 2006

(65) Prior Publication Data
US 2007/0045877 A1    Mar. 1, 2007

(30) Foreign Application Priority Data
Jul. 29, 2005    (KR) .................... 10-2005-0069408

(51) Int. Cl.
*H01L 21/311* (2006.01)
(52) U.S. Cl. .................. 438/700; 438/238; 438/740; 257/E21.548; 257/E21.647; 257/E21.655
(58) Field of Classification Search ............. 438/700, 438/238, 672, 723, 724, 740
See application file for complete search history.

(56) References Cited

U.S. PATENT DOCUMENTS 6,218,262 B1 *  4/2001  Kuroi et al. ............... 438/401
6,624,525 B2 *  9/2003  Anezaki et al. ............ 257/797
6,906,374 B2 *  6/2005  Tanaka ...................... 257/306
6,969,648 B2 * 11/2005  Cheng et al. .............. 438/249

FOREIGN PATENT DOCUMENTS

KR    10-2001-0004673 A    1/2001

* cited by examiner

*Primary Examiner*—David Nhu
(74) *Attorney, Agent, or Firm*—Townsend and Townsend and Crew LLP

(57) ABSTRACT

A method for forming an alignment mark comprises forming an etch stop film and an interlayer insulating film over a semiconductor substrate including a cell region and a scribe region, etching a predetermined region of the interlayer insulating film and the etch stop film to form a storage node region in the cell region and an alignment mark region in the scribe region, forming a layer for storage node over an entire surface of the resultant including the storage node region in the cell region and the alignment mark region in the scribe region, etching the layer for storage node until the interlayer insulting film is exposed, and removing the interlayer insulating film to form a capacitor in the cell region and an alignment mark in the scribe region.

12 Claims, 8 Drawing Sheets

METHOD FOR FORMING ALIGNMENT MARK

CROSS-REFERENCES TO RELATED APPLICATIONS

The present application claims priority to Korean patent application number 10-2005-0069408, filed on Jul. 29, 2005, which is incorporated by reference in its entirety.

BACKGROUND OF THE INVENTION

The present invention relates to a lithography process used to fabricate semiconductor devices.

FIG. 1 is a simplified cross-sectional view illustrating conventional box-in-box type alignment marks.

FIGS. 2a through 2e are simplified cross-sectional views illustrating a conventional method for forming an alignment mark, wherein FIGS. 2a(ii) through 2e(ii) are cross-sectional views taken along the line I-I' of FIG. 1.

Referring to FIGS. 2a and 2b, a stacked structure of an etch stop nitride film 30 and an interlayer insulating film 40 is formed over a semiconductor substrate 10 having a lower structure such as a storage node contact plug 20 and a bit line 25 in a cell region 1000a and a scribe region 1000b. A predetermined region of the interlayer insulating film 40 and the etch stop nitride film 30 is etched to form a storage node region 45 in the cell region 1000a and an alignment mark region 47 in the scribe region 1000b. A layer for storage node 50 is formed over an entire surface of the resulting structure including the storage node region 45 in the cell region 1000a and the alignment mark region 47 in the scribe region 1000b.

Referring to FIGS. 2c and 2d, the layer for storage node 50 is planarized until the interlayer insulating film 40 is exposed to separate a storage node 55 from its neighboring storage node 55. A photoresist film (not shown) is formed to cover the cell region 1000a including the storage node region 45 shown in FIG. 2a. The layer for storage node 50 in the scribe region 1000b is removed.

Referring to FIG. 2e, the photoresist film is removed. The interlayer insulating film 40 is removed to form a cylindrical capacitor 60 in the cell region 1000a and an alignment mark 65 in the scribe region 1000b.

FIGS. 3a and 3b are photographs according to the conventional method for forming a semiconductor device. After the process for removing the layer for storage node 50 in the scribe region 1000b shown in FIG. 2d, a conductive particle is placed over the storage node 55 shown in FIG. 2d, and a residue of the conductive particle remains at a sidewall of the alignment mark 65 shown in FIG. 2e.

According to the above conventional method for forming an alignment mark, during a process for forming the cylindrical capacitor, the residue of the conductive particle remains at the sidewall of the alignment mark, which causes the conductive particle to be placed over the capacitor. As a result, the capacitor of the device may fail. Accordingly, there is a need to perform an additional process for removing a remaining conductive material in the scribe region, which is called a POM (Peri open mask) process.

BRIEF SUMMARY OF THE INVENTION

Embodiments of the present invention relates to a method for forming an alignment mark wherein an alignment mark in a scribe region is formed in a similar manner to a capacitor in a cell region with a dummy plug disposed under the alignment mark to support the alignment mark, thereby preventing a residue of a conductive particle disposed at a lower part of the alignment mark during a process of removing an interlayer insulating film. As a result, a POM (Peri open mask) process, which is used to remove the residue of the conductive particle at the lower part of the alignment mark, can be skipped. Accordingly, the process for forming an alignment mark can be made simple and the process cost can be reduced.

According to an embodiment of the present invention, a method for forming an alignment mark includes: forming an etch stop film and an interlayer insulating film over a semiconductor substrate including a cell region and a scribe region; etching a predetermined region of the interlayer insulating film and the etch stop film to form a storage node region in the cell region and an alignment mark region in the scribe region; forming a layer for storage node over an entire surface of the resultant including the storage node region in the cell region and the alignment mark region in the scribe region; etching the layer for storage node until the interlayer insulting film is exposed; and removing the interlayer insulating film to form a capacitor in the cell region and an alignment mark in the scribe region, wherein the alignment mark in the scribe lane region is formed in a similar manner as that of the capacitor in the cell region.

In one embodiment, a method for forming an alignment mark on a semiconductor substrate includes forming an etch stop film over a cell region and a scribe region defined on a semiconductor substrate. An interlayer insulating film is formed over the etch stop film. The interlayer insulating film and the etch stop film are etched to form first trenches in the cell region and second trenches in the scribe region at the same time, the first trenches defining a storage node region, the second trenches defining an alignment mark region. A conductive layer is formed over the first and second trenches, so that the conductive layer includes vertical portions formed on sidewalls of the first and second trenches and upper lateral portions formed on an upper surface of the interlayer insulating film. The upper lateral portions of the conductive layer are etched to expose the upper surface of the interlayer insulting film. The exposed interlayer insulating film is removed to form a capacitor in the cell region and an alignment mark in the scribe region. The cell region has a contact plug between the substrate and the capacitor, and the scribe region has a dummy plug between the substrate and the alignment mark.

DESCRIPTION OF SPECIFIC EMBODIMENT

Figure 1:
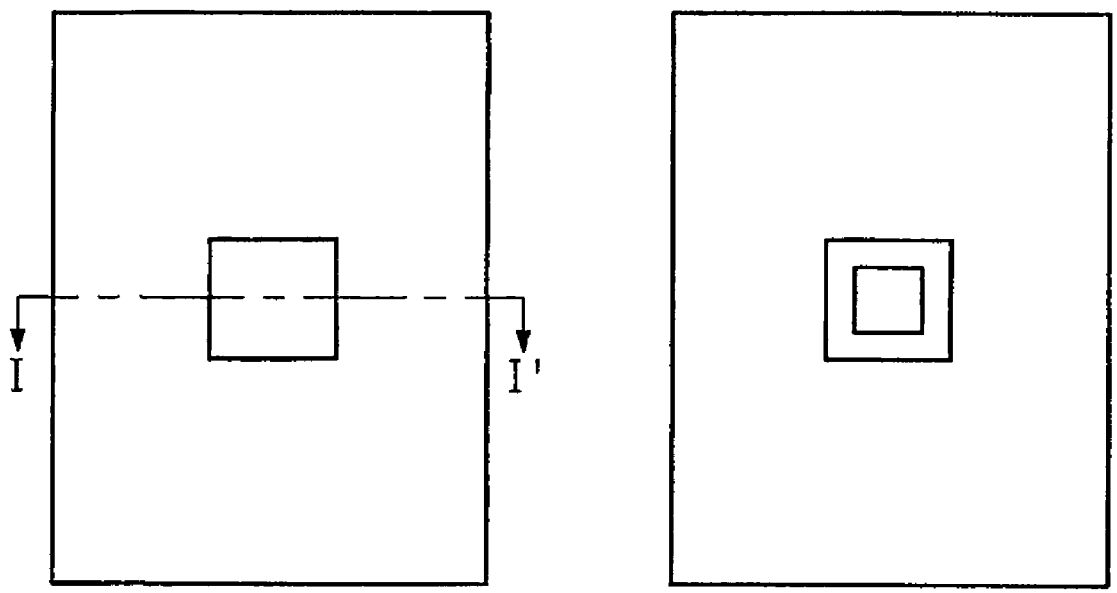
FIG. 1 is a simplified top view illustrating a conventional alignment mark.
Figure 2A:
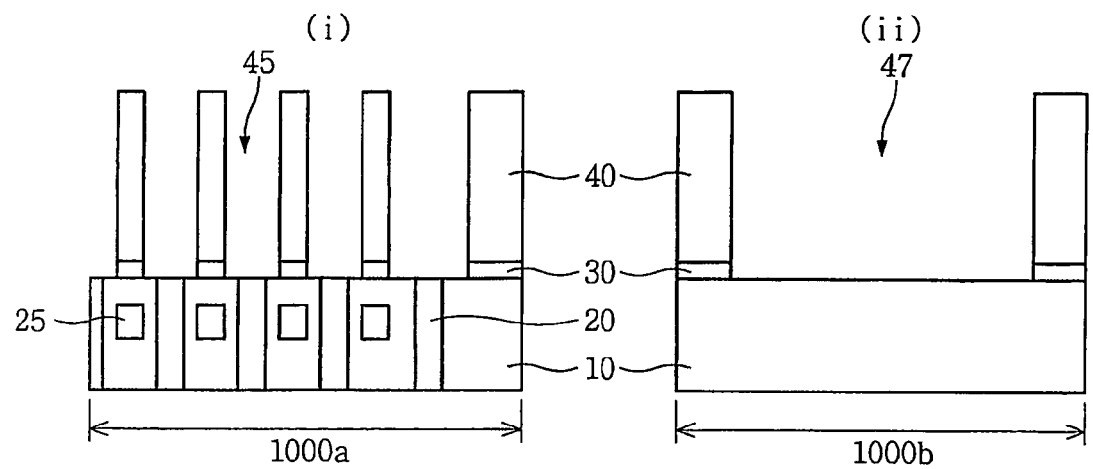
FIGS. 2a through 2e are simplified cross-sectional views illustrating a conventional method for forming an alignment mark.
Figure 2B:
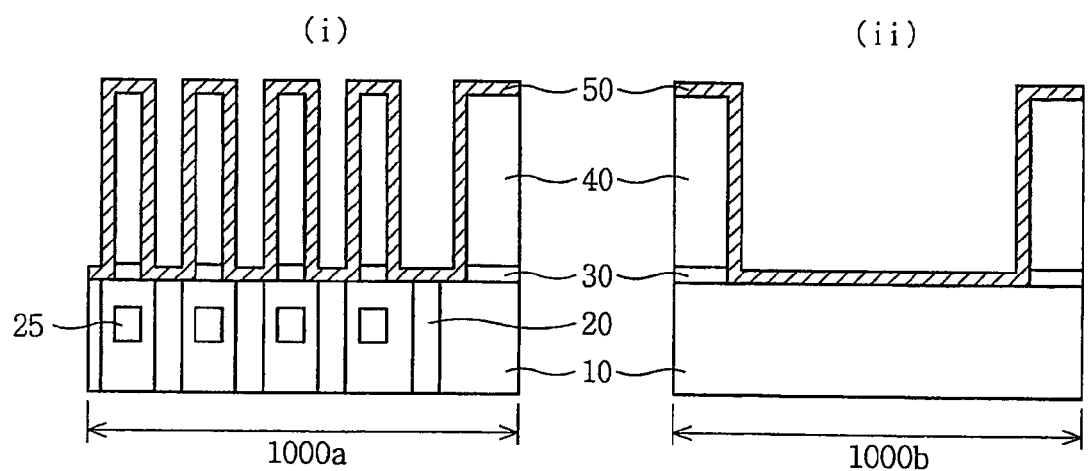
Figure 2C:
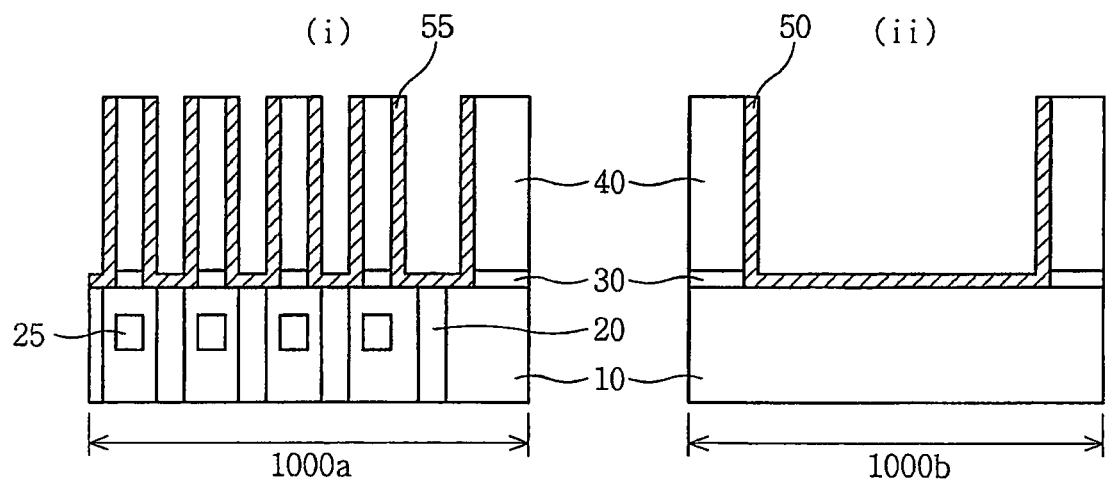
Figure 2D:
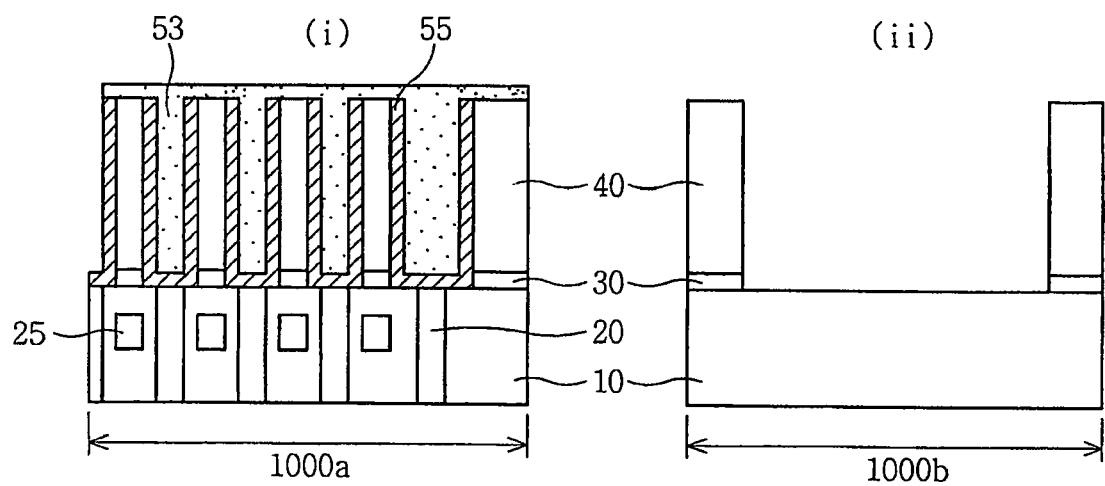
Figure 2E:
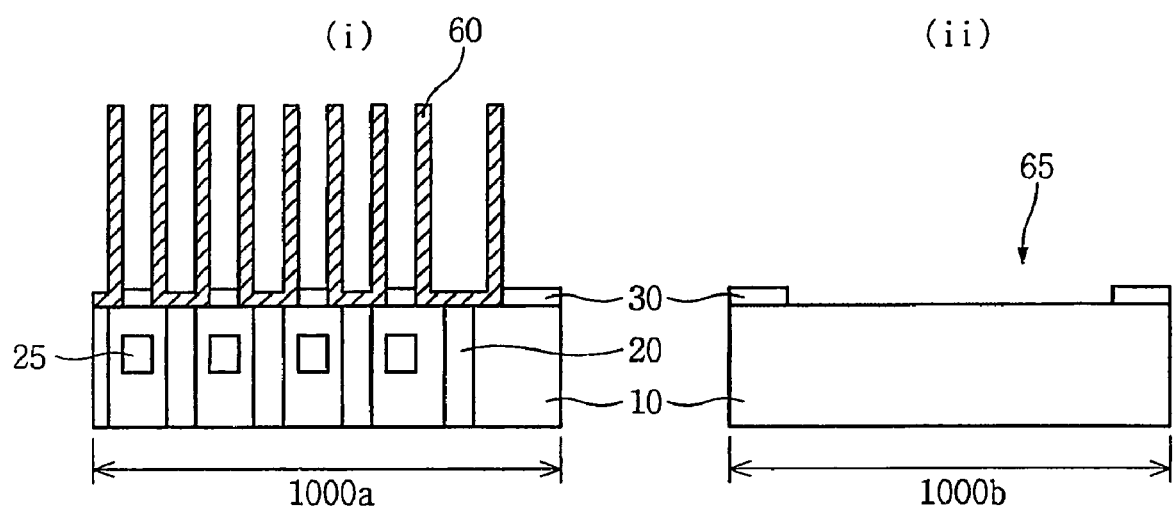
Figure 3A:
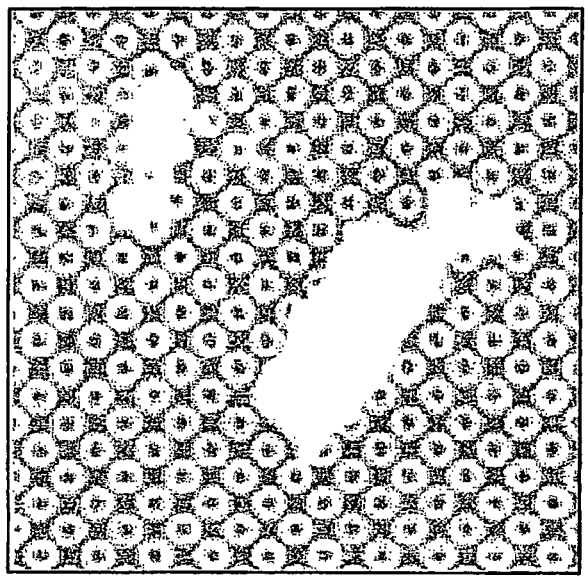
FIGS. 3a and 3b are photographs according to a conventional method for forming a semiconductor device.
Figure 3B:
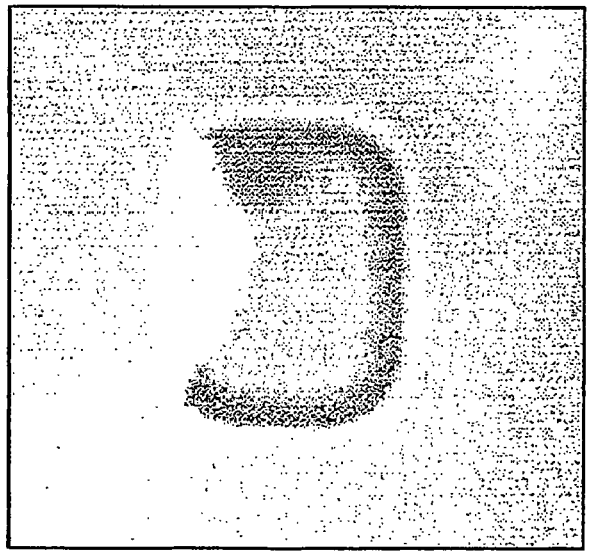
Figure 4A:
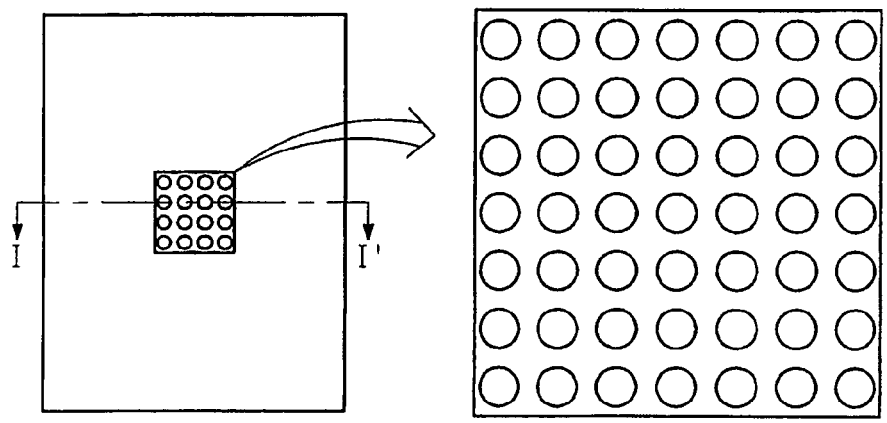
FIGS. 4a through 4c are simplified layouts of an alignment mark according to one embodiment of the present invention.
Figure 4B:
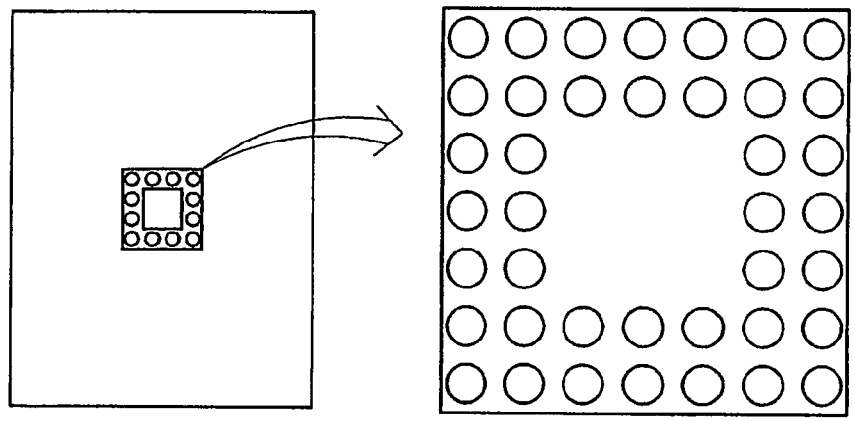
Figure 4C:
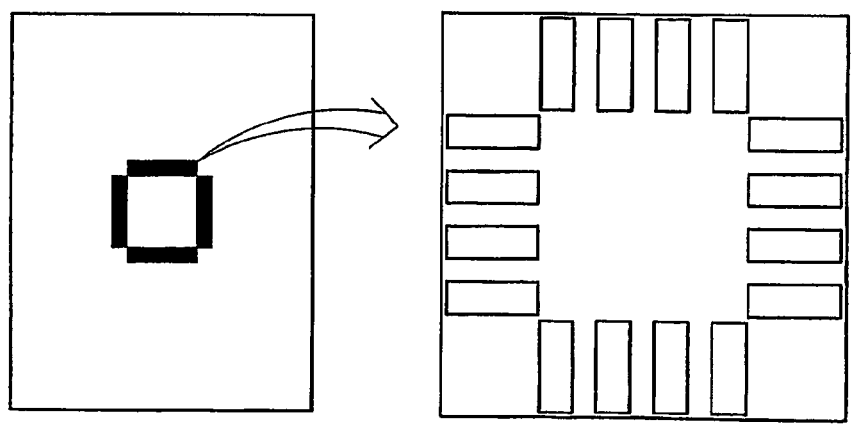

FIGS. 4a through 4c are simplified layouts of an alignment mark according to one embodiment of the present invention.

Referring to FIGS. 4a and 4b, in accordance with one embodiment of the present invention, the overall size and shape of the alignment mark is similar to that of a conventional alignment mark. In one embodiment of the present invention, the alignment mark in the scribe region is formed with a plurality of small contact hole patterns that is substantially the same as that of capacitors in a cell region. The capacitors have cylindrical shape in the present embodiment. The size of the small contact hole pattern of the alignment mark in the scribe region is equal to or greater than that of the cylindrical capacitor in the cell region. The size of the small contact hole pattern of the alignment mark, however, is less than that of a conventional alignment mark (that is, the diameter of the small contact hole pattern ranges from about 0.1 µm to 0.3 µm).

Referring to FIG. 4c, an alignment mark is formed with a plurality of small line/space patterns. In one embodiment of the present invention, a width of the line/space pattern of the alignment mark is equal to that of the conventional alignment mark (that is, the width of the line/space pattern ranges from about 0.1 µm to 0.3 µm).

Accordingly, a lower structure of the alignment mark in the scribe region is similar to that of the capacitor in the cell region. As a result, the conductive particle, which has occurred at the sidewall of the conventional alignment mark, can be prevented.

Figure 5A:
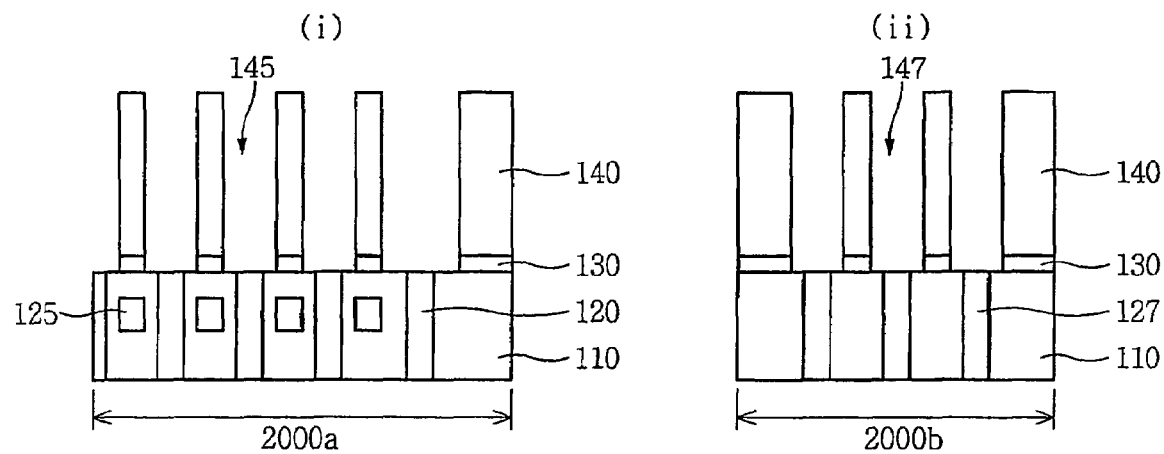
FIGS. 5a through 5d are simplified cross-sectional views illustrating a method for forming an alignment mark according to one embodiment of the present invention.

FIGS. 5a through 5d are simplified cross-sectional views illustrating a method for forming an alignment mark according to one embodiment of the present invention, wherein FIGS. 5a(ii) through 5d(ii) are simplified cross-sectional views taken along the line I-I' of FIG. 4a. An etch stop film 130 and an interlayer insulating film 140 are formed over a semiconductor substrate 110 in a cell region 2000a and a scribe region 2000b with a lower structure such as a bit line 125, a storage node contact plug 120, and a dummy plug 127. A predetermined region of the interlayer insulating film 140 and the etch stop film 130 are etched to form a storage node region 145 in the cell region 2000a and an alignment mark region 147 in the scribe region 2000b. In one embodiment of the present invention, the etch stop film 130 is formed of a nitride film and the interlayer insulating film 140 is formed of an oxide film. In addition, the alignment mark region 147 is formed with a mask shown in FIG. 4a, which has a plurality of small contact hole-type patterns. In another embodiment, the mask for forming the alignment mark region 147 can be used as one of masks shown in FIGS. 4b and 4c. Accordingly, the alignment mark region 147 in the scribe region 2000b is formed in a together with the storage node region 145 in the cell region 2000a.

Figure 5B:
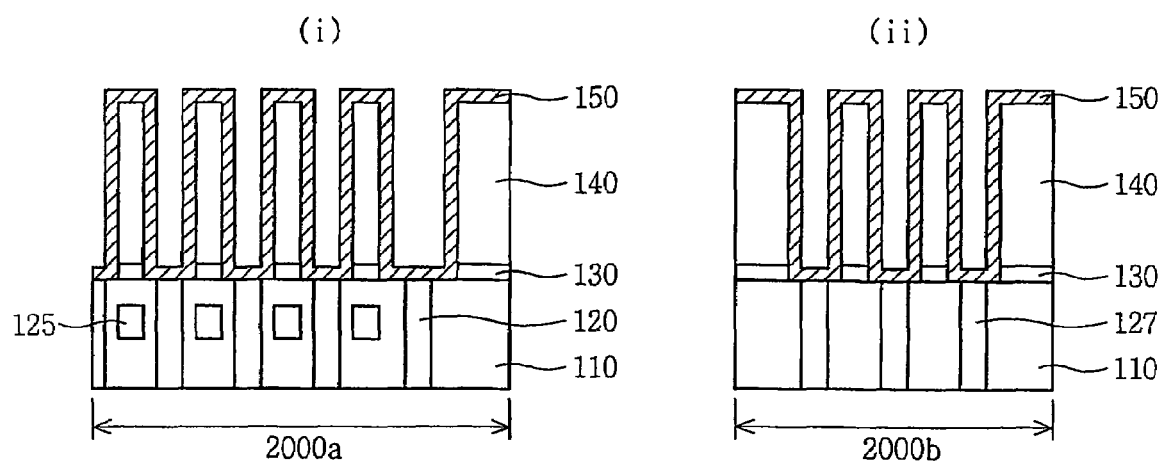
Figure 5C:
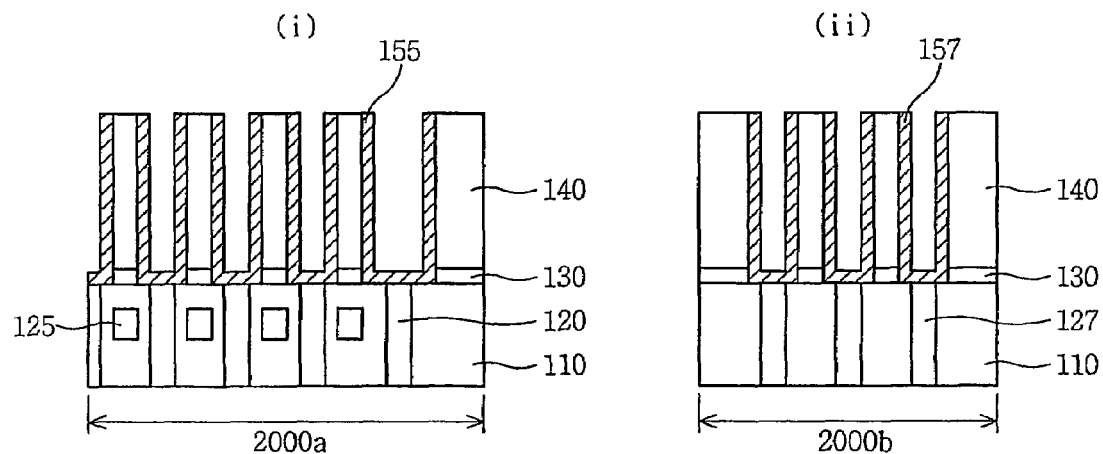
Figure 5D:
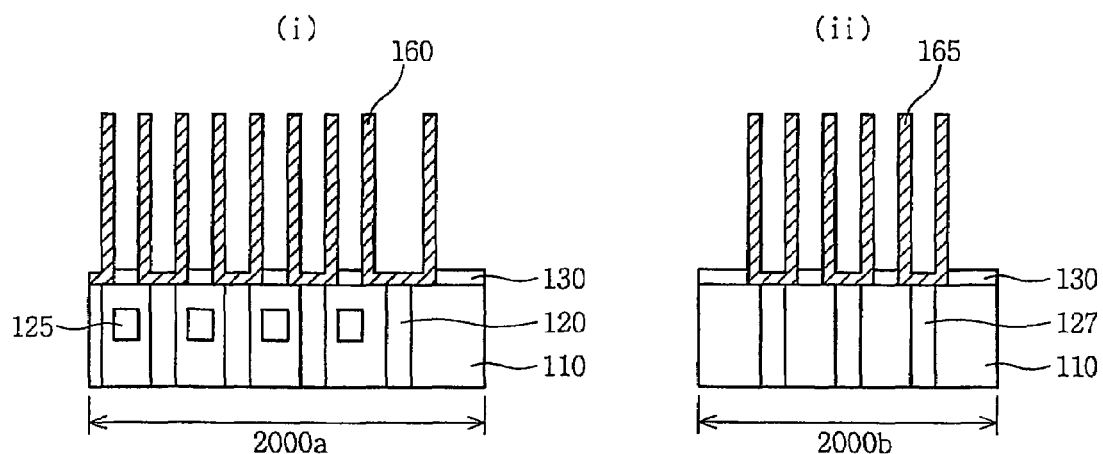

Referring to FIGS. 5b through 5d, a conductive layer for storage node 150 is formed over an entire surface of the resultant including the storage node region 145 in the cell region 2000a and the alignment mark region 147 in the scribe region 2000b. The conductive layer for storage node 150 is etched until the interlayer insulating film 140 is exposed to form a storage node 155 and an alignment mark pattern 157, which are respectively separated from a neighboring storage node 155 and a neighboring alignment mark pattern 157. The interlayer insulating film 140 is removed to form a capacitor 160 in the cell region 2000a and an alignment mark 165 in the scribe region 2000b. In one embodiment of the present invention, the conductive layer for storage node 150 is formed of TiN, Ti, or a combination thereof. In addition, the alignment mark 165 in the scribe region 2000b is formed of a plurality of the small separated alignment mark patterns with a contact hole-type or line/space-type pattern. As a result, the alignment mark 165 is formed in a similar manner to the capacitor 160 in the cell region 2000a. Since a lower structure of the alignment mark 165 in the scribe region 2000b is similar to that of the capacitor 160 in the cell region 2000a, a residue of a conductive particle occurring over the capacitor for forming an alignment mark can be prevented to skip an additional POM process.

As described above, the method for forming an alignment mark in accordance with an embodiment of the present invention provides to design an alignment mark in a scribe region in a similar manner to a capacitor in a cell region with a dummy plug under the alignment mark to support the alignment mark, thereby skipping a POM process for removing the residue of conductive particle at the sidewall of the alignment mark, which occurs during the process of removing the interlayer insulating film. Accordingly, the process of fabricating a semiconductor device can be made simple and the process cost can be reduced.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for forming a semiconductor device, comprising:
    forming an etch stop film and an interlayer insulating film over a semiconductor substrate including a cell region and a scribe region;
    etching a predetermined region of the interlayer insulating film and the etch stop film to form a storage node region in the cell region and an alignment mark region in the scribe region, the storage node region and the alignment mark region being formed at the same time;
    forming a conductive layer for storage nodes over the storage node region and over the alignment mark region;
    etching the conductive layer for storage nodes until the interlayer insulting film is exposed, wherein the etched conductive layer forms a conductive pattern in the cell region and the alignment mark region; and
    removing the interlayer insulating film such that the conductive pattern forms a capacitor in the cell region and an alignment mark in the scribe region at the same time.

2. The method for forming a semiconductor device according to claim 1, wherein the etch stop film comprises a nitride film.

3. The method for forming a semiconductor device according to claim 1, wherein the interlayer insulating film comprises an oxide film.

4. The method for forming a semiconductor device according to claim 1, wherein the conductive layer for storage nodes comprises one selected from TiN, Ti, and a combination thereof.

5. The method for forming a semiconductor device according to claim 1, further comprising forming a dummy plug under the alignment mark.

6. The method for forming a semiconductor device according to claim 1, wherein the alignment mark includes a plurality of small patterns.

7. The method for forming a semiconductor device according to claim 6, wherein each small pattern includes a contact hole type pattern.

8. The method for forming a semiconductor device according to claim 6, wherein each small pattern includes a line/space type pattern.

9. The method for forming a semiconductor device according to claim 1, wherein the alignment mark and the capacitor have substantially the same shape.

10. A method for forming a semiconductor device, comprising:

forming an etch stop film over a cell region and a scribe region defined on a semiconductor substrate;

forming an interlayer insulating film over the etch stop film;

etching the interlayer insulating film and the etch stop film to form first trenches in the cell region and second trenches in the scribe region at the same time, the first trenches defining a storage node region, the second trenches defining an alignment mark region;

forming a conductive layer over the first and second trenches, so that the conductive layer includes vertical portions formed on sidewalls of the first and second trenches and upper lateral portions formed on an upper surface of the interlayer insulating film;

etching the upper lateral portions of the conductive layer to expose the interlayer insulting film, wherein the etched conductive layer including the vertical portions forms a first conductive pattern in the cell region and a second conductive pattern in the alignment region; and removing the exposed interlayer insulating film to form a capacitor in the cell region and an alignment mark in the scribe region.

11. The method for forming a semiconductor device according to claim 10, wherein the cell region has a contact plug between the substrate and the capacitor, and the scribe region has a dummy plug between the substrate and the alignment mark.

12. The method for forming a semiconductor device according to claim 10, wherein the first conductive pattern has substantially the same shape as the second conductive pattern.

* * * * *